(12) United States Patent
Maruyama et al.

(10) Patent No.: US 7,746,082 B2
(45) Date of Patent: Jun. 29, 2010

(54) PARTIAL DISCHARGE DETECTION DEVICE

(75) Inventors: Shiro Maruyama, Yokohama (JP);
Takaaki Sakakibara, Yokohama (JP);
Toshihiro Hoshino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 11/949,585

(22) Filed: Dec. 3, 2007

(65) Prior Publication Data

US 2009/0027062 A1 Jan. 29, 2009

(30) Foreign Application Priority Data

Dec. 4, 2006 (JP) .............................. 2006-327181

(51) Int. Cl.
G01R 31/02 (2006.01)
H01H 9/50 (2006.01)

(52) U.S. Cl. ...................................... 324/544; 324/536

(58) Field of Classification Search ................. 324/544, 324/551, 555, 557, 541, 382, 403, 409, 536, 324/678, 76.65, 87, 76.32, 12, 76.34, 51, 324/76.67, 71, 76.76, 45, 237, 238, 216, 324/240, 123 R, 122, 512, 718, 456

See application file for complete search history.

(56) References Cited

U.S. PATENT DOCUMENTS 5,804,972 A * 9/1998 de Kock et al. ............. 324/536
2007/0139056 A1 * 6/2007 Kaneiwa et al. ............. 324/536

FOREIGN PATENT DOCUMENTS

| JP | 3-78429 | 4/1991 |
| JP | 8-29482 | 2/1996 |
| JP | 8-146076 | 6/1996 |
| JP | 10-341520 | 12/1998 |
| JP | 2000-111604 | 4/2000 |
| JP | 2001-194411 | 7/2001 |
| JP | 2002-340969 | 11/2002 |

OTHER PUBLICATIONS

Machine Translation of JP 10341520 A.*
Hirata, H., "Coaxial Waveguide Transition," Basics of Micro-wave Engineering, Chapter 5.7, pp. 95-97, (2004).
Iwashita, H. et al., "Antenna Device for Monitoring Insulation," Patent Abstracts of Japan, JP No. 03-078429, Publication Date: Apr. 3, 1991, (1 Sheet).

(Continued)

Primary Examiner—Hoai-An D Nguyen
(74) Attorney, Agent, or Firm—Finnegan, Henderson, Farabow, Garrett & Dunner, L.L.P.

(57) ABSTRACT

The present invention provides a high-performance partial discharge detection device which is user-friendly and compact and which allows detection of the electromagnetic waves caused by partial discharge, over a wide bandwidth with a simple constitution and a favorable S/N ratio. The waveguide antenna which receives electromagnetic waves that leak from the insulating spacer is attached to the outer circumferential face of the insulating spacer. The waveguide antenna is constituted by a waveguide portion and a coaxial cable connector which is installed on the waveguide portion. The waveguide portion has a metal short-circuit plate provided at one end thereof, and an opening formed at the other end thereof, which covers part of the outer circumferential face of the insulating spacer.

6 Claims, 6 Drawing Sheets

OTHER PUBLICATIONS

Rokunohe, T. et al., "Partial Discharge Detection Method," Patent Abstracts of Japan, JP. No. 2002-071743, Publication Date: Mar. 12, 2002, (1 Sheet).

Ishigaki, K. et al., "Partial Discharge Detector, and Partial Discharge Testing Method," Patent Abstracts of Japan, JP. No. 2006-329636, Publication Date: Dec. 7, 2006, (1 Sheet).

* cited by examiner

PARTIAL DISCHARGE DETECTION DEVICE

BACKGROUND OF THE INVENTION

1. Field of the Invention

The present invention relates to a partial discharge detection device that detects partial discharge which is generated in a gas-insulated equipment, and more particularly to a partial discharge detection device which is capable of detecting, with high sensitivity, electromagnetic waves caused by the partial discharge generation.

2. Description of the Related Art

Generally, gas-insulated equipments such as gas-insulated switchgears, gas-insulated generating lines, and gas-insulated transformers are employed in transformer substations. Gas-insulated equipments are devices in which a high voltage conductor is housed in a hermetically sealed metal container which is charged with an insulating gas and supported by means of an insulator. It is known that, in a gas-insulated equipment, when there is a defective part with which there is poor contact in the metal container or which is invaded by a metallic foreign body, partial discharge from the defective part is generated.

When partial discharge in a gas-insulated equipment is neglected, before long insulation damage is incurred and there is the danger that the damage will develop into a serious accident. Hence, it is essential to discover partial discharge at an early stage and take precautions against serious accidents by implementing countermeasures of some kind such as the repair of defective parts. Therefore, a partial discharge detection device that detects partial discharge in a gas-insulated equipment has been proposed as a technology for preventive maintenance for insulation diagnosis of the gas-insulated equipment.

Methods for detecting partial discharge in a gas-insulated equipment include methods for detecting electric current, electromagnetic waves, sound, vibration, and light, and so forth. Among such detection devices, devices for determining the existence of partial discharge by detecting electromagnetic wave signals caused by partial discharge have favorable detection sensitivity, a good S/N ratio, and a wide detection range and so forth and have garnered attention. In particular, because the electromagnetic waves caused by partial discharge include signals extending from several dozen MHz to several GHz, procedures for detecting UHF-band electromagnetic waves (300 MHz to 3 GHz) have come into the mainstream.

A conventional example of a partial discharge detection device will be described here using FIG. 5. As shown in FIG. 5, in a gas-insulated equipment 10, an insulating gas such as $SF_6$ gas is enclosed in a ground-potential hermetically sealed metal container 22 which houses a high-voltage conductor 25, and the high-voltage conductor 25 is supported by an insulating spacer 24 comprising an insulator. The partial discharge detection device which is inserted in the gas-insulated equipment 10 is constituted by an internal detector 27, a matching circuit 28, an amplifier 29, a measurement tool 30, and a determination tool 31.

Among these components, the internal detector 27 is an electrode that detects electromagnetic waves 36 in the metal container 22 and is installed on a flange 26 of a low electric field hand hole of the metal container 22. Furthermore, the matching circuit 28 comprises a filter or the like and is adapted to pull the detection signal of the internal detector 27 outside the metal container 22 via a pullout section and to specify the frequency band of the detection signal. The amplifier 29, measurement tool 30, and determination tool 31 are sequentially connected to the matching circuit 28. The amplifier 29 performs processing to amplify the detection signal whose frequency band has been specified by the matching circuit 28 and the processed signal is measured by the measurement tool 30 so the existence of partial discharge which is generated inside the gas-insulated equipment 10 is ultimately determined by the determination tool 31.

The partial discharge detection device as described above operates as follows. First, when partial discharge is generated in a defective part 35 inside the gas-insulated equipment 10, electromagnetic waves 36 from several dozen MHz to several dozen GHz due to partial discharge in the metal container 22 are generated. Here, the hermetically sealed metal container 22 propagates electromagnetic waves 36 as a result of waveguide theory. Further, the internal detector 27 detects electromagnetic waves 36 in the metal container 22 and the matching circuit 28 specifies the frequency band of the electromagnetic waves 36 thus detected. In addition, the amplifier 29 and measurement tool 30 perform signal processing on the specified frequency and the determination tool 31 judges the existence of an anomaly with the gas-insulated equipment.

Thus, by detecting electromagnetic waves 36 by means of the internal detector 27, the partial discharge detection device is able to detect, with high sensitivity, partial discharge by defective part 35 which is generated in the gas-insulated equipment 10. Moreover, in the conventional example in FIG. 5, because the internal detector 27 is installed inside the metal container 22, a noise signal from outside the metal container 22 can be attenuated and the partial discharge in the metal container 22 can be detected with a favorable S/N ratio.

Further, the electromagnetic waves which progress within the waveguide must satisfy boundary conditions at the boundary plane of the waveguide and Maxwell's electromagnetic equations. Hence, when electromagnetic waves are propagating within the metal container 22 which is the waveguide, the boundary conditions of the metal surface, that is, the conditions that the electric field be perpendicular to the metal surface and that the magnetic field be parallel must be satisfied. The following progressive waves exist as electromagnetic waves which satisfy these conditions.

First, in the case of electromagnetic waves for which the direction of travel is the axial direction of the metal container 22, progressive waves which do not possess an electric field or magnetic field component in the direction of travel are called 'Transverse Electromagnetic Waves (TEM waves). However, as a result of the boundary conditions, although the electric field travel direction component is zero, there exist also Transverse Electric waves (TE waves) in which a magnetic field travel direction component exists or Transverse Magnetic waves (TM waves) in which the magnetic field travel direction component is zero but in which an electric field travel direction component exists. Various modes exist for such TE waves and TM waves.

In a rectangular waveguide, a cut-off frequency which is determined by the shape of the waveguide exists and electromagnetic waves of a lower frequency than TE10 mode which is the lowest frequency are attenuated. Hence, the electromagnetic waves of a frequency equal to or less than the cut-off frequency are attenuated greatly and not propagated. For example, in cases where a rectangular waveguide and a coaxial waveguide are connected by means of a microwave circuit or the like, for example, it is said that only electromagnetic waves at or below the cut-off wavelength which can be propagated by the waveguide can be converted to electromagnetic waves which propagate along the coaxial waveguide and that electromagnetic waves at or above the cut-off wavelength cannot propagate along the coaxial waveguide.

With regard to this point, the coaxial waveguide converter that appears in 'Basis for Microwave Engineering', Hiratani et al., Japan Science and Technology Publishing) will be described as a specific example (See FIGS. 6 and 7). In FIG. 6, 40 is a rectangular waveguide made of metal at one end of which a metal short-circuit plate 41 is provided and at the other end of which a waveguide connection flange 42 for a connection with another waveguide is provided.

Furthermore, a coaxial cable connector 43 is provided on one face of the waveguide 40 (upper side in FIG. 6). FIG. 7 shows a cross-sectional view of the coaxial waveguide converter and the impedance which corresponds with the coaxial conversion of the rectangular waveguide differs from the coaxial characteristic impedance. Therefore, in order to alleviate the mismatch caused by the disparity between the two impedances, L and d shown in FIG. 7 are adjusted through experimentation. Numeral 44 denotes electrical wiring.

The operation of the coaxial waveguide converter will be described next. The electromagnetic waves which are propagated by the waveguide (not shown) which is connected to the waveguide connection flange 42 are converted into electromagnetic waves which propagate along a coaxial structure line constituted by a coaxial inner conductor 43a and a coaxial outer conductor 43b. Here, the coaxial waveguide converter in FIG. 6 propagates only electromagnetic waves at or below the cut-off wavelength which can be propagated within the waveguide to a coaxial line but is unable to propagate electromagnetic waves at or above the cut-off wavelength to the coaxial line.

In addition, as a conventional technology for a partial discharge detection device which detects the existence of partial discharge from electromagnetic waves which are produced by a gas-insulated equipment, a technology that detects electromagnetic waves which leak in from the opening in an impedance discontinuous plane of a spacer or bushing by means of an antenna which is placed close to the opening has been proposed. Otherwise, a method that involves disposing a slit antenna or dipole antenna along a spacer flange as per the technology of Japanese Application Laid Open No. H3-78429 is also known. According to these methods, there is no need to attach a detector inside the metal container of the gas-insulated equipment and there is therefore the advantage that electromagnetic waves can be detected using a simple constitution.

As mentioned hereinabove, in a gas-insulated equipment 10 that comprises a hermetically sealed metal container 22, because electromagnetic waves are propagated within the metal container 22 on the basis of the waveguide theory, the electromagnetic waves can be detected with high sensitivity by the internal detector 27. However, the internal detector 27 shown in FIG. 5 is provided inside the metal container 22 of the gas-insulated equipment 10. Hence, it has proven difficult to retro-fit an internal detector 27 to a gas-insulated equipment which does not have the internal detector 27 attached beforehand and hard to detect electromagnetic waves.

Therefore, as a method that makes it possible to detect electromagnetic waves with a simple constitution, a test that detects electromagnetic waves which have leaked from an opening in an impedance discontinuous plane such as a spacer or bushing is carried out and a method in which an antenna is installed in an external space of the gas-insulated equipment and a method that involves disposing a slit antenna or dipole antenna along the outer circumference of the spacer have been proposed.

However, the following problems with these methods were noted. That is, with a slit antenna, an electrical connection to the metal container was essential. Further, because the impedance is discontinuous, the detection sensitivity of both methods was low and there was a high susceptibility to the effects of external noise. Hence, the S/N ratio was inadequate and the partial discharge could not be detected highly accurately.

Moreover, in the case of a rectangular waveguide, the cut-off frequency is decided by the shape of the waveguide and the wavelength of the electromagnetic waves propagated by the long side dimension of the waveguide is constrained, meaning that propagation of electromagnetic waves of wavelengths equal to or more than two times the long side dimension of the waveguide cross-section is inefficient. More specifically, in order to propagate electromagnetic wave signals in the UHF band (300 MHz to 3 GHz, wavelength: 100 mm to 1000 mm), a rectangular waveguide with a long side that is equal to or more than 500 mm is required. Therefore, the coaxial waveguide converter shown in FIGS. 6 and 7 has a large form and, when the form is integrated in a partial discharge detection device, this has the inconvenience of enlarging the device.

SUMMARY OF THE INVENTION

The present invention was proposed to resolve the problems confronted by conventional technologies such as those mentioned above and an object of the present invention is to provide a high-performance partial discharge detection device which is user-friendly and compact and which allows detection of the electromagnetic waves caused by partial discharge, over a wide bandwidth with a simple constitution and a favorable S/N ratio.

In order to achieve the above object, the present invention is a device which is integrated in a gas-insulated equipment in which a high voltage conductor is supported by an insulator inside a hermetically sealed metal container charged with an insulating gas, and which detects partial discharge in the gas-insulated equipment, comprising receiving means for receiving electromagnetic waves which leak from the insulator; signal processing means for signal-processing the electromagnetic waves received by the receiving means; and signal processing determination means for determining, from the value of a signal that is signal-processed by the signal processing means, whether electromagnetic waves due to partial discharge generated inside the gas-insulated equipment are received, wherein the receiving means comprises a waveguide portion and a coaxial cable connector that is attached to the waveguide portion; the waveguide portion has a metal short-circuit plate at one end thereof, and an opening at the other end thereof, which is formed opposite the insulator; and a coaxial cable for measurement is attached to the coaxial cable connector and the signal processing means is connected to the coaxial cable.

According to the present invention with a constitution of this kind, when electromagnetic waves generated in accordance with partial discharge propagate within a hermetically sealed metal container, the receiving means receives electromagnetic waves which leak from the insulator. Here, because the opening in the waveguide of the receiving means is open opposite the insulator, the effects of external noise can be suppressed and electromagnetic waves can be received as a result of the waveguide portion itself acting as an electromagnetic wave detection antenna.

Therefore, the detected electromagnetic waves can be sent to the signal processing means by using a coaxial cable attached to a coaxial cable connector and, after signal processing on the electromagnetic waves has been performed by the signal processing means, the signal processing determination means is able to judge whether partial discharge exists.

Furthermore, in the partial discharge detection device of the present invention, the waveguide portion is used as the electromagnetic wave receiving means, and therefore, an antenna with a simple constitution can be constituted. Hence, it is easy to attach the receiving means outside the metal container and a simplification of the device structure is possible.

According to the present invention, by employing receiving means which comprises a waveguide portion and a coaxial cable connector as an electromagnetic wave detection antenna, a high-performance partial discharge detection device can be provided which is user-friendly and compact and which allows detection of the electromagnetic waves caused by partial discharge, over a wide bandwidth and with a favorable S/N ratio.

DESCRIPTION OF THE PREFERRED EMBODIMENTS

Figure 5:
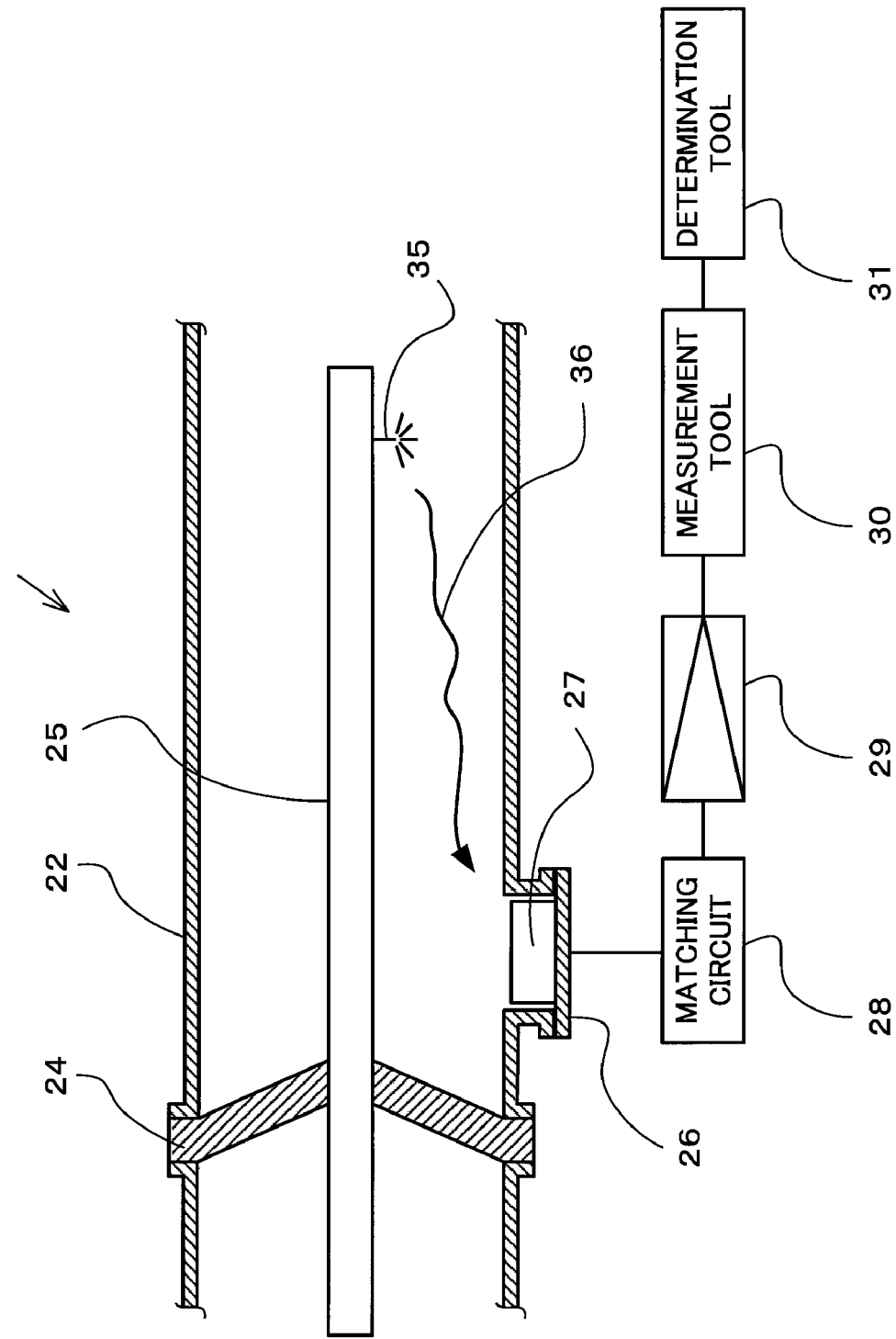
FIG. 5 is a cross-sectional view of a gas-insulated switchgear to which a conventional partial discharge detection device has been attached.
Figure 6:
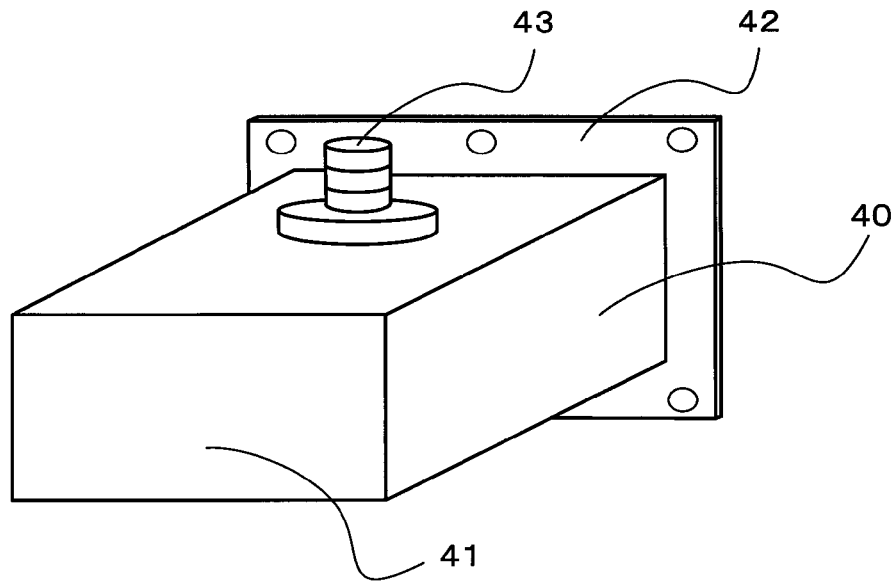
FIG. 6 is a schematic view of a conventional coaxial waveguide converter.
Figure 7:
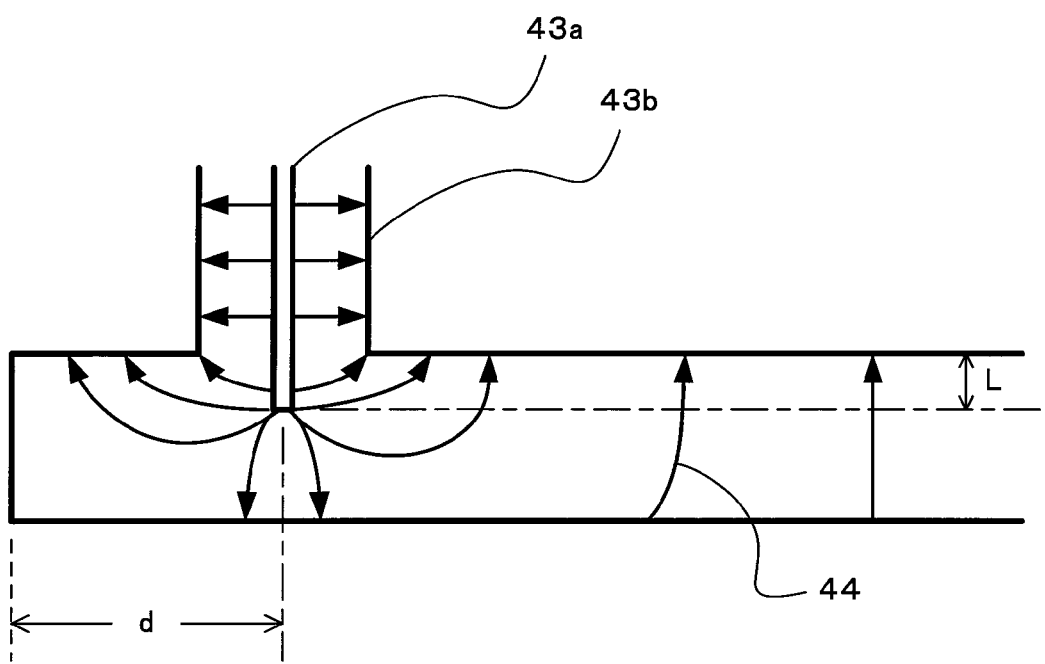
FIG. 7 is a cross-sectional view of a conventional coaxial waveguide converter.

A representative embodiment of the present invention will be specifically described hereinbelow with reference to FIGS. 1 to 3. This embodiment is a partial discharge detection device that detects partial discharge by determining electromagnetic waves which are generated in a gas-insulated equipment in the same manner as the conventional technology shown in FIG. 5.

(1) Constitution of this Embodiment

Figure 1:
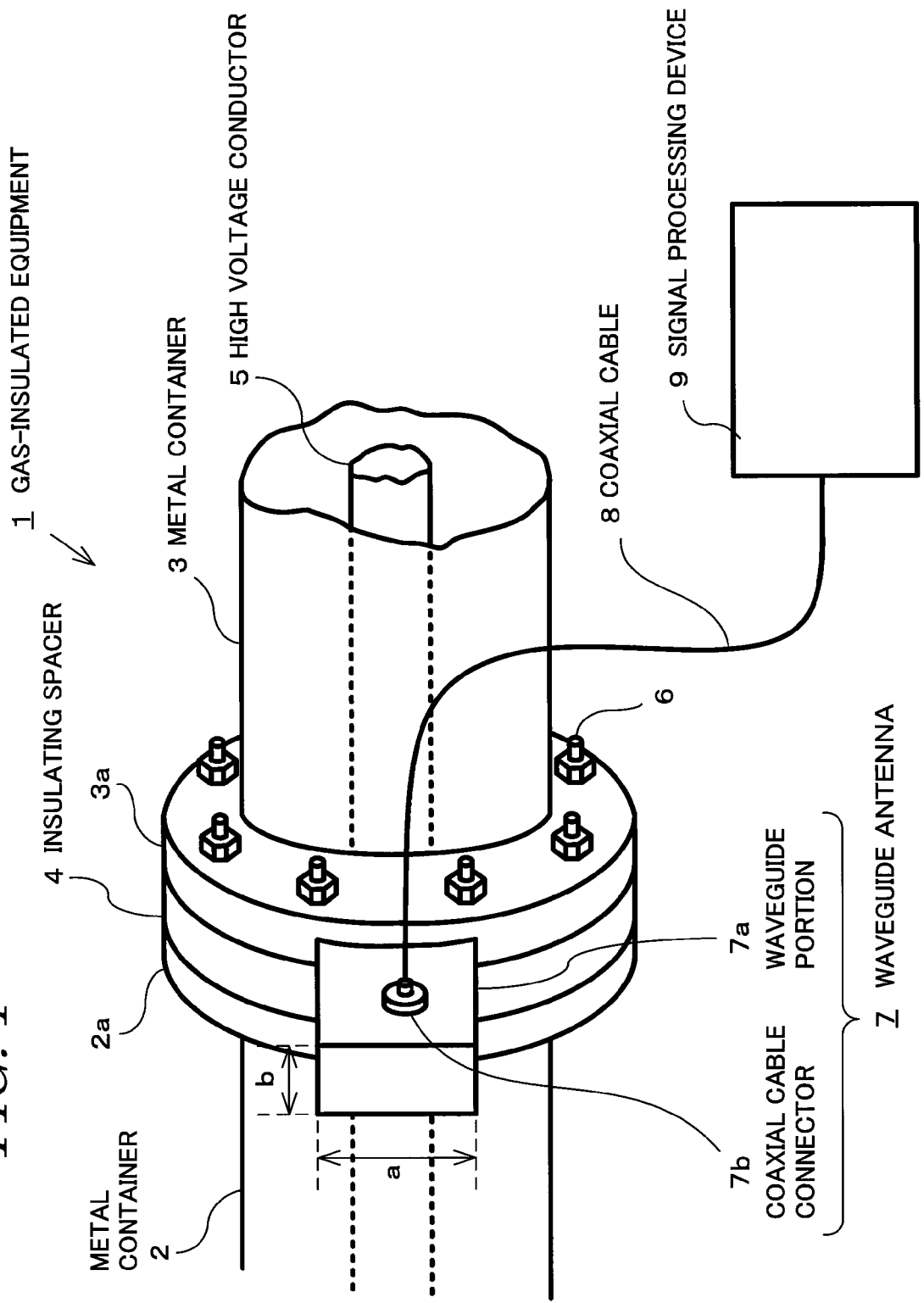
FIG. 1 is a constitutional view of a representative embodiment of the present invention which includes a conceptual view of a gas-insulated switchgear into which is integrated a partial discharge detection device of this embodiment.
Figure 2:
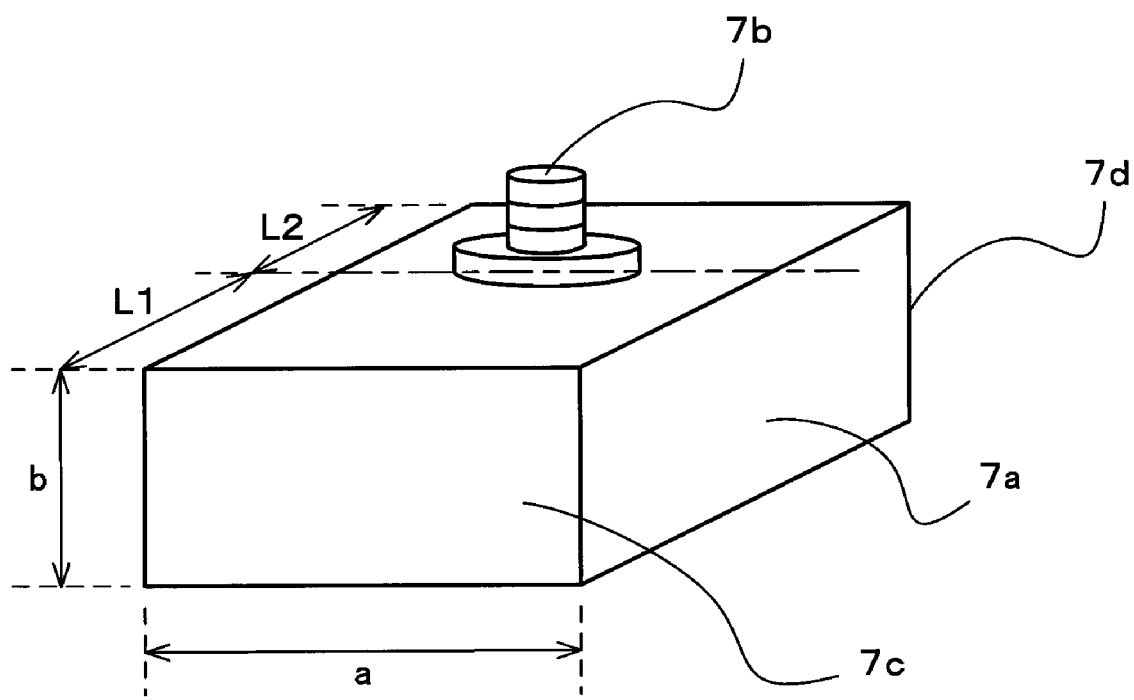
FIG. 2 is a detailed view of the receiving means of the partial discharge detection device of this embodiment.

FIG. 1 is a constitutional view including a perspective view of a gas-insulated equipment to which this embodiment is applied and FIG. 2 is a perspective view of the receiving means according to this embodiment. The gas-insulated equipment 1 has a high voltage conductor 5 inserted in hermetically sealed metal containers 2 and 3 which are charged with an insulating gas and the high voltage conductor 5 is supported by an insulating spacer 4 which is an insulator. The circumference of the insulating spacer 4 is sandwiched between flange portions 2a and 3a of the metal containers 2 and 3 and assembly bolts 6 are linked integrally by passing through the edges of the flange portions 2a and 3a and insulating spacer 4.

A waveguide antenna 7 which constitutes the receiving means of this embodiment is attached to the outer circumferential face of the insulating spacer 4. The waveguide antenna 7 is a part that receives electromagnetic waves which leak from the insulating spacer 4 and is constituted by a waveguide portion 7a and a coaxial cable connector 7b which is installed on the waveguide portion 7a.

Of these parts, the waveguide portion 7a has a metal short-circuit plate 7c provided at one end thereof and an opening 7d is formed at the other end opposite the short-circuit plate 7c. The opening 7d in the waveguide antenna 7 is formed by cutting a rectangular waveguide having a long side a and a short side b such that the long side is parallel to the end faces of the flange portions 2a and 3a of the metal containers 2 and 3 and the opening 7d is disposed to cover part of the outer circumferential face of the insulating spacer 4.

In addition, as shown in FIG. 2, in the waveguide antenna 7, the distance L2 between the position of the coaxial cable connector 7b and the opening 7d is set at no more than ¼ of the cut-off wavelength $\lambda c$ of the waveguide portion 7a. For example, in cases where the long side a and short side b of the waveguide antenna 7 are a=110 mm and b=55 mm respectively, the cut-off wavelength is 220 mm and the cut-off frequency fc is approximately 1.36 GHz.

In addition, the central conductor of the coaxial cable connector 7b is disposed parallel to the high voltage conductor 5 in the axial direction thereof. Further, a coaxial cable for measurement 8 is attached to the coaxial cable connector 7b and the coaxial cable connector 7b is connected to the signal processing device 9 via the coaxial cable 8.

The signal processing device 9 is constituted by a bandpass filter, an amplification section, and a waveguide, and so forth. In addition, the signal processing determination section is integrated in the signal processing device 9 so as to detect whether electromagnetic waves caused by partial discharge are received, that is, the presence or absence of partial discharge, based on the level and pattern of the electromagnetic waves thus received.

(2) Action of this Embodiment

The action of this embodiment will be described subsequently. When partial discharge occurs inside the gas-insulated equipment 1, electromagnetic waves of several dozen MHz to several dozen GHz are generated by the partial discharge inside the metal containers 2 and 3 and these electromagnetic waves propagate within the waveguide constituted by the metal containers 2 and 3. In addition, the electromagnetic waves that propagate within the metal containers 2 and 3 are transmitted to the flange portions 2a and 3a and propagate to the opening 7d of the waveguide antenna 7 provided opposite the circumferential portion of the insulating spacer 4.

As mentioned earlier, in cases where the long side a and short side b of the waveguide antenna 7 are a=110 mm and b=55 mm respectively, the cut-off wavelength is 220 mm and the cut-off frequency fc is approximately 1.36 GHz. Hence, normally, electromagnetic waves of frequencies equal to or less than 1.36 GHz do not propagate with large attenuation. However, in this embodiment, in the waveguide antenna 7 shown in FIG. 2, the length L2 between the opening 7d and the coaxial cable connector 7b is set at no more than ¼ of the cut-off wavelength $\lambda c$ and, therefore, an electromagnetic wave component at or less than the cut-off frequency that cannot be propagated within the waveguide portion 7a can also exist inside the waveguide portion 7a. Hence, electromagnetic wave signals for which the cut-off frequency fc of the waveguide antenna 7 is no more than fc=1.36 GHz can be detected.

In addition, the waveguide antenna 7 shown in FIG. 1 is disposed such that the opening 7d is opposite the outer circumferential face of the insulating spacer 4 and is constituted by the waveguide portion 7a and short circuit plate 7c for signals from other directions and shielded from external noise. Hence, an antenna with a favorable S/N ratio can be constituted for the electromagnetic wave signals caused by the partial discharge generated inside the gas-insulated equipment 1.

Figure 3:
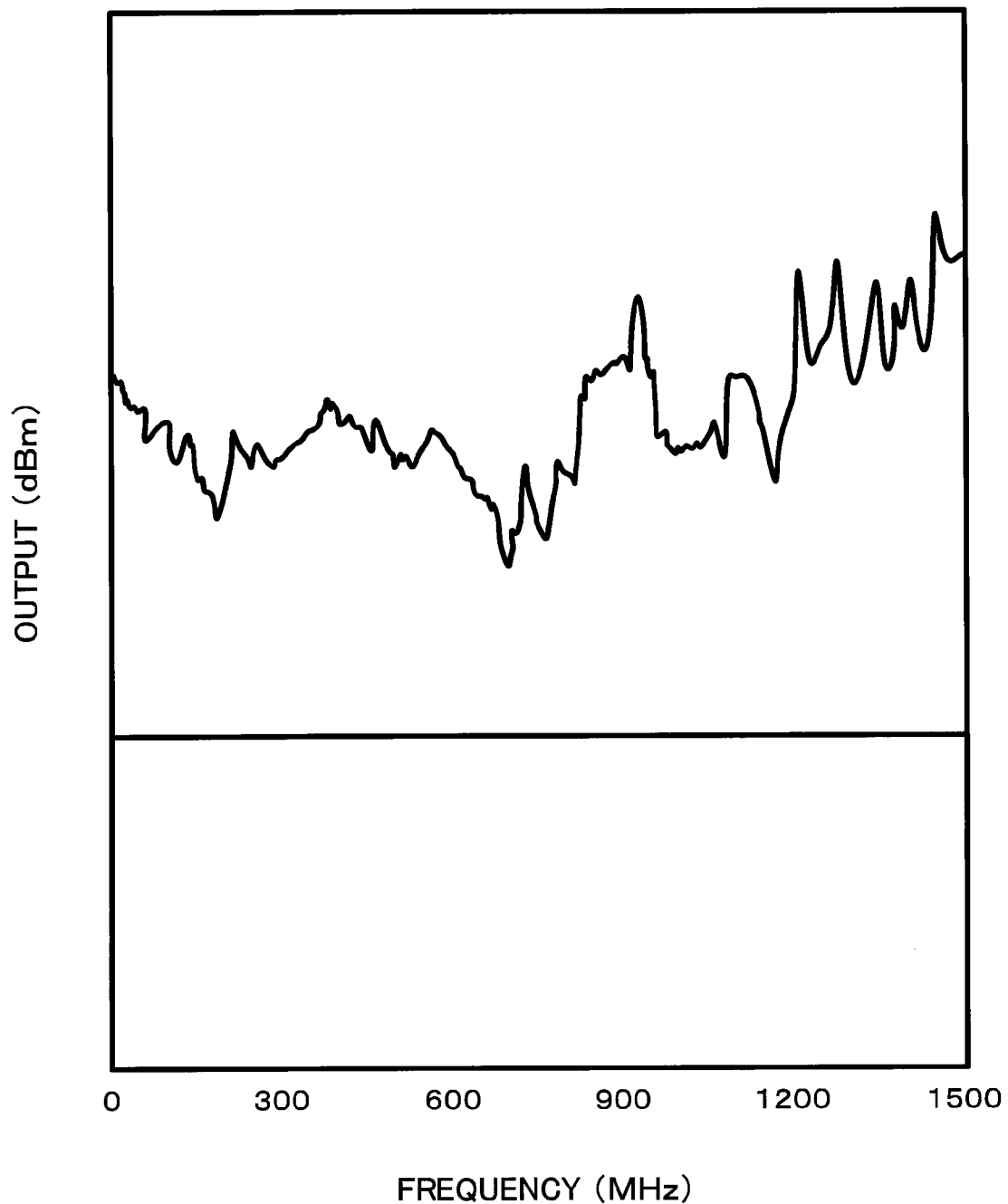
FIG. 3 is a characteristic diagram showing a measured example of a frequency spectrum of this embodiment.

Here, an example of measurement of the electromagnetic wave signals caused by the partial discharge inside the metal container 3 of this embodiment is shown in FIG. 3. As is clear from the characteristic diagram of FIG. 3, even in the case of a small waveguide antenna 7 the long side a and short side b of which are a=110 mm and b=55 mm respectively and the cut-off frequency of which is 1.36 GHz, it is possible to detect the electromagnetic wave signals that span a wide frequency band equal to or less than the cut-off frequency 1.36 GHz. The frequency band shown in FIG. 3 covers the majority of a frequency band extending from several dozen MHz to several GHz which is effective in partial discharge detection in the frequency band of the electromagnetic waves that are generated due to the partial discharge. As a result, even in the case of a small waveguide antenna 7 which is sized such that the long side a and short side b thereof are a=110 mm and b=55 mm respectively, the majority of the frequency band of the electromagnetic wave signals caused by the partial discharge can be covered.

When the waveguide antenna 7 detects an electromagnetic wave signal, the coaxial cable connector 7b converts the electromagnetic wave signal into a voltage signal across the coaxial cable 8, and the signal processing device 9 receives the voltage signal via the coaxial cable 8. Further, the signal processing device 9 judges whether electromagnetic waves due to partial discharge have been received and detects the presence or absence of partial discharge on the basis of the level and pattern or the like of the electromagnetic waves thus received.

(3) Action of this Embodiment

As mentioned hereinabove, in this embodiment, because the electromagnetic waves caused by partial discharge are detected directly by the waveguide antenna 7 and, therefore, the partial discharge signal can be detected with a favorable S/N ratio and with high sensitivity. In addition, because the length L2 between the opening 7d and the coaxial cable connector 7b is set at no more than ¼ of the cut-off wavelength λc, the electromagnetic waves of a frequency band of no more than 1.36 GHz can be detected even by means of a waveguide antenna 7 which is sized such that the long side a and short b are a=110 mm and b=55 mm respectively. As a result, a partial discharge detection device which is capable of detecting partial discharge signals in the UHF band by means of a waveguide antenna 7 of relatively small size can be implemented.

(4) Further Embodiments

Figure 4:
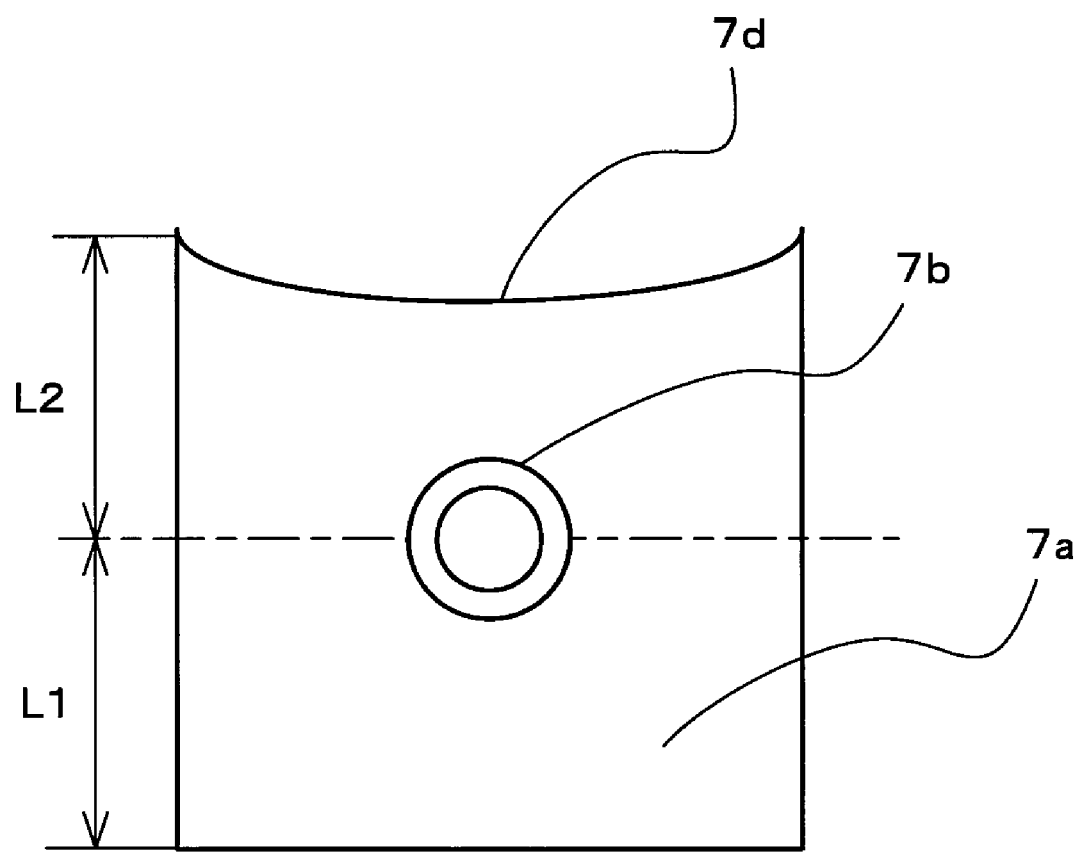
FIG. 4 is a detailed view of receiving means of another embodiment of the present invention.

The present invention is not limited to the above embodiment and, as shown in FIG. 4, for example, the end face of the opening 7d can also be made arc-shaped so that the distance L2 between the position of the coaxial cable connector 7b and the opening 7d of the waveguide antenna 7 is continuously changed. With such an embodiment, the electromagnetic wave signal band that is able to enter the waveguide portion 7a can be widened and the waveguide portion 7a can be made to gaplessly contact the outer circumference of the insulating spacer 4 on the circumference. Therefore, the invasion of noise signals from the outside can be effectively suppressed. As a result, the electromagnetic waves caused by the partial discharge generation can be detected with high sensitivity.

In addition, the waveguide portion 7a of the waveguide antenna 7 is constituted by a slide-type dual waveguide and the signal attenuation which is at or below the cut-off frequency can also be varied so that the distance L2 between the position of the coaxial cable connector 7b and the opening 7d can be changed. According to this embodiment, the electromagnetic waves can be detected efficiently with optimum sensitivity in accordance with the status of electromagnetic wave generation by adjusting L2 to maximize the output signal from the waveguide antenna 7.

What is claimed is:

1. A partial discharge detection device which is used in a gas-insulated equipment in which a high voltage conductor is supported by an insulator inside a hermetically sealed metal container charged with an insulating gas, and which detects partial discharge in the gas-insulated equipment, comprising:
    receiving means for receiving electromagnetic waves which leak from the insulator;
    signal processing means for signal-processing the electromagnetic waves received by the receiving means; and
    signal processing determination means for determining, from the value of a signal that is signal-processed by the signal processing means, whether electromagnetic waves due to partial discharge generated inside the gas-insulated equipment are received,
    wherein the receiving means comprises a waveguide portion and a coaxial cable connector that is attached to the waveguide portion;
    the waveguide portion has a metal short-circuit plate at one end thereof, and an opening at the other end thereof, which is formed opposite the insulator;
    a coaxial cable for measurement is attached to the coaxial cable connector and the signal processing means is connected to the coaxial cable; and
    in the receiving means, the distance between the position of the coaxial cable connector and the opening of the waveguide portion is set at no more than ¼ a cut-off wavelength of the waveguide portion.

2. The partial discharge detection device according to claim 1, wherein the opening in the waveguide portion is made to contact the outer circumference of the insulator.

3. The partial discharge detection device according to claim 1, wherein the cutout shape of the opening in the waveguide portion of the receiving means is a circular arc.

4. The partial discharge detection device according to claim 1, wherein the receiving means has a structure in which the distance between the position of the coaxial cable connector and the opening in the waveguide portion is variable.

5. The partial discharge detection device according to claim 1, wherein a conductor of the coaxial cable connector of the receiving means is disposed parallel to the high voltage conductor in the gas-insulated equipment.

6. The partial discharge detection device according to claim 1, wherein the waveguide portion of the receiving means has a slide-type multiple structure.

* * * * *